(12) United States Patent
Park et al.

(10) Patent No.: US 6,465,866 B2
(45) Date of Patent: Oct. 15, 2002

(54) TRENCH ISOLATION REGIONS HAVING TRENCH LINERS WITH RECESSED ENDS

(75) Inventors: Tai-su Park; Moon-han Park; Kyung-won Park; Han-sin Lee, all of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/911,096

(22) Filed: Jul. 23, 2001

(65) Prior Publication Data

US 2001/0041421 A1 Nov. 15, 2001

Related U.S. Application Data

(62) Division of application No. 09/684,822, filed on Oct. 10, 2000, now Pat. No. 6,331,469.

(30) Foreign Application Priority Data

Oct. 12, 1999 (KR) .............................................. 99-43989

(51) Int. Cl.[7] .............................................................. H01L 21/76
(52) U.S. Cl. ...................................... 257/510; 438/435
(58) Field of Search .......................... 257/510; 438/424, 438/436, 435

(56) References Cited

U.S. PATENT DOCUMENTS

| | | | |
|---|---|---|---|
| 4,352,724 A | 10/1982 | Susishima et al. | 204/192 |
| 4,390,393 A | 6/1983 | Ghezzo et al. | 156/643 |
| 4,571,819 A | 2/1986 | Rogers et al. | 29/576 |
| 4,631,803 A | 12/1986 | Hunter et al. | 29/576 |
| 4,636,281 A | 1/1987 | Buiguez et al. | 156/643 |
| 4,656,497 A | 4/1987 | Rogers et al. | 357/50 |
| 4,825,277 A | 4/1989 | Mattox et al. | 357/49 |
| 4,826,887 A | 6/1989 | Daubenspeck et al. | 156/643 |
| 4,960,727 A | 10/1990 | Mattox et al. | 437/67 |
| 5,189,501 A | 2/1993 | Kawamura et al. | 257/647 |
| 5,190,889 A | 3/1993 | Poon et al. | 437/67 |
| 5,206,182 A | 4/1993 | Freeman | 437/33 |
| 5,223,736 A | 6/1993 | Rodder | 257/506 |
| 5,316,965 A | 5/1994 | Philipossian et al. | 437/70 |
| 5,387,539 A | 2/1995 | Yang et al. | 437/67 |

(List continued on next page.)

FOREIGN PATENT DOCUMENTS

| | | | |
|---|---|---|---|
| EP | 0 071 204 A2 | 2/1983 | H01L/21/76 |
| EP | 0 532 361 A2 | 3/1993 | H01L/21/76 |
| EP | 001052690 A2 | 11/2000 | H01L/21/336 |
| JP | 61137338 A | 6/1986 | |
| KR | 1999-0057708 | 7/1999 | H01L/21/76 |
| WO | WO 86/02777 | 5/1986 | H01L/21/76 |

OTHER PUBLICATIONS

Stanley Wolf, Silicon Processing for the VSLI ERA, vol. 1, Lattice Press, 1986, pp. 546 and 581.

(List continued on next page.)

*Primary Examiner*—Olik Chaudhuri
*Assistant Examiner*—David S Blum
(74) *Attorney, Agent, or Firm*—Myers Bigel Sibley & Sajovec

(57) ABSTRACT

A trench isolation structure which prevents a hump phenomenon and an inverse narrow width effect of transistors by rounding the top edges of a trench and increasing the amount of oxidation at the top edges of a trench, a semiconductor device having the trench isolation structure, and a trench isolation method are provided. In this trench isolation method, a trench is formed in non-active regions of a semiconductor substrate. An inner wall oxide film having a thickness of 10 to 150 Å is formed on the inner wall of the trench. A liner is formed on the surface of the inner wall oxide film. The trench is filled with a dielectric film. Part of the liner is etched so that the top ends of the silicon nitride liner are recessed from the surface of the semiconductor substrate.

10 Claims, 6 Drawing Sheets

U.S. PATENT DOCUMENTS

| | | | |
|---|---|---|---|
| 5,447,884 A | 9/1995 | Fahey et al. | 437/67 |
| 5,472,904 A | 12/1995 | Figura et al. | 437/67 |
| 5,474,953 A | 12/1995 | Shimizu et al. | 437/67 |
| 5,492,858 A | 2/1996 | Bose et al. | 437/67 |
| 5,521,422 A | 5/1996 | Mandelman et al. | 257/510 |
| 5,554,256 A | 9/1996 | Jruijmboom et al. | 156/643.1 |
| 5,561,073 A | 10/1996 | Jerome et al. | 437/31 |
| 5,578,518 A | 11/1996 | Koike et al. | 437/67 |
| 5,612,242 A | 3/1997 | Hsu | 437/56 |
| 5,643,823 A | 7/1997 | Ho et al. | 437/67 |
| 5,674,775 A | 10/1997 | Ho et al. | 437/67 |
| 5,677,233 A | 10/1997 | Abiko | 437/67 |
| 5,677,234 A | 10/1997 | Koo et al. | 437/69 |
| 5,679,599 A | 10/1997 | Mehta | 437/69 |
| 5,696,020 A | 12/1997 | Ryum et al. | 437/72 |
| 5,712,185 A | 1/1998 | Tsai et al. | 437/67 |
| 5,712,205 A | 1/1998 | Park et al. | 438/425 |
| 5,719,085 A | 2/1998 | Moon et al. | 438/424 |
| 5,728,621 A | 3/1998 | Zheng et al. | 438/427 |
| 5,750,433 A | 5/1998 | Jo | 438/424 |
| 5,753,562 A | 5/1998 | Kim | 438/424 |
| 5,763,315 A | 6/1998 | Benedict et al. | 438/424 |
| 5,780,346 A | 7/1998 | Arghavani et al. | 438/296 |
| 5,786,262 A | 7/1998 | Jang et al. | 438/424 |
| 5,834,358 A | 11/1998 | Pan et al. | 438/424 |
| 5,837,595 A | 11/1998 | Ahn et al. | 438/443 |
| 5,837,612 A | 11/1998 | Ajuria et al. | 438/697 |
| 5,858,842 A | 1/1999 | Park | 438/297 |
| 5,861,104 A | 1/1999 | Omid-Zohoor | 216/84 |
| 5,863,827 A | 1/1999 | Joyner | 438/425 |
| 5,866,465 A | 2/1999 | Doan et al. | 438/424 |
| 5,872,045 A | 2/1999 | Lou et al. | 438/432 |
| 5,885,883 A | 3/1999 | Park et al. | 438/435 |
| 5,940,716 A | 8/1999 | Jin et al. | 438/424 |
| 5,976,951 A | 11/1999 | Huang et al. | 438/435 |
| 5,977,585 A | 11/1999 | Vasche | 257/321 |
| 5,989,978 A | 11/1999 | Peidous | 438/436 |
| 5,994,200 A | 11/1999 | Kim | 438/425 |
| 6,001,707 A | 12/1999 | Lin et al. | 438/433 |
| 6,004,862 A | 12/1999 | Kim et al. | 438/425 |
| 6,008,108 A | 12/1999 | Huang et al. | 438/436 |
| 6,030,882 A | 2/2000 | Hong | 438/433 |
| 6,037,237 A | 3/2000 | Park et al. | 438/424 |
| 6,054,343 A | 4/2000 | Ashburn | 438/221 |
| 6,057,208 A | 5/2000 | Lin et al. | 438/424 |
| 6,074,932 A | 6/2000 | Wu | 438/435 |
| 6,090,684 A | 7/2000 | Ishituska et al. | 438/424 |
| 6,093,611 A | 7/2000 | Gardner et al. | 438/295 |
| 6,103,635 A | 8/2000 | Chau et al. | 438/739 |
| 6,107,159 A | 8/2000 | Chuang | |
| 6,159,823 A | 12/2000 | Song et al. | 438/437 |
| 6,171,928 B1 | 1/2001 | Lou | |
| 6,187,651 B1 | 2/2001 | Oh | 438/435 |
| 6,255,194 B1 * | 7/2001 | Hong | 438/424 |

OTHER PUBLICATIONS

Park, et al., "Correlation between Gate Oxide Reliability and the Profile of the Trench Top Corner in Shallow Trench Isolation (STI)," International Electron Devices Meeting, 1996, pp. 747–750.

Search Report, Application No. GB 0024940.9; Jul. 19, 2001.

Notice to Submit Response (Translation Included), Korean Application No. 10–1999–0043989, Aug. 30, 2001.

* cited by examiner

TRENCH ISOLATION REGIONS HAVING TRENCH LINERS WITH RECESSED ENDS

RELATED APPLICATION

This application is a divisional of U.S. patent application Ser. No. 09/684,822, filed Oct. 10, 2000, now U.S. Pat. No. 6,331,469, the disclosure of which is hereby incorporated herein by reference.

BACKGROUND OF THE INVENTION

1. Field of the Invention

The present invention relates to a trench isolation structure, a semiconductor device having this structure, and a trench isolation method, and more particularly, to a trench isolation structure which prevents a hump phenomenon and an inverse narrow width effect of transistors by rounding the top corners of a trench and increasing the oxidation amount at these areas.

2. Description of the Related Art

Isolation between elements of a semiconductor device can be usually achieved by local oxidation of silicon (LOCOS) or trench isolation.

Between the two, the LOCOS method is simply conducted, and can simultaneously form wide isolation films and narrow isolation films. However, in the LOCOS method, a bird beak  is formed by side oxidation, and thus an isolation region becomes wide, which leads to a reduction in the effective area of a source/drain region. Also, in the LOCOS method, stress which depends on the difference in a thermal expansion coefficient is concentrated at the edges of an oxide film during formation of a field oxide film, which causes crystal defects to be formed on a silicon substrate and results in a large amount of leakage current.

Hence, a trench isolation technique is necessarily required. Using a trench isolation technique, an isolation region can be kept small compared to the above-described LOCOS technique, with an effective isolation length made long at the same isolation width by forming a trench in a silicon substrate and filling the trench with a dielectric material such as oxide.

Among several processes for achieving isolation using trenches, how to form the profile of a trench is very important to produce a stable device. That is, a trench depth, a trench angle and the shape of a trench edge must be appropriately controlled. In particular, when shallow trench isolation (STI) is used in highly-integrated semiconductor devices, it is not too much to say that the electrical characteristics of devices are determined by the profile of the edge portions of a trench.

FIG. 1 is a cross-sectional view for explaining a problem which has been encountered in a conventional STI method. Here, reference numeral 1 is a semiconductor substrate, reference numeral 3 is an isolation film embedded in an STI region, reference numeral 5 is a gate oxide film, and reference numeral 7 is a gate electrode.

As shown in FIG. 1, the following problems occur when the edge portions of a trench are formed with a sharp angle of almost 90°. First, a gate conductive layer covers the top corner portions of a trench during formation of a gate, so that an electric field is concentrated at the corners of a trench. As shown in FIG. 2, this leads to a hump phenomenon in which a transistor is turned on twice, and an inverse narrow width effect, resulting in degradation of the performance of transistors.

FIG. 3 is a graph showing an inverse narrow width effect occurring in an STI structure. As shown in this graph, an inverse narrow width effect represents a reduction in threshold voltage with a decrease in the channel width of a transistor. Here, reference character X represents data acquired before a hump phenomenon occurs, and reference character Y represents data acquired after a hump phenomenon occurs.

The second problem occurring when the edge portions of a trench are formed with a sharp angle of almost 90° is degradation of the reliability of devices, such as, the dielectric breakdown of a gate oxide film caused by formation of a thin gate oxide film at the edge portions of a trench or by concentration of an electric field on the gate oxide film around the edges of a trench.

Several methods have been proposed to solve the above problems. One method is disclosed in U.S. Pat. Nos. 5,861,104 and 5,763,315.

U.S. Pat. No. 5,861,104 discloses a method of rounding the upper corners of a trench by improving a method of etching a trench. U.S. Pat. No. 5,763,315 discloses a method of rounding the upper edges of a trench by forming a (111) plane having a high oxidation rate on a semiconductor substrate with (100) crystal planes, using a wet etching technique or the like, and of preventing a degradation in the reliability of transistors and a gate oxide film by increasing the thickness of the gate oxide film which is formed on the upper edges of a trench.

The present invention intends to provide a structure for forming a (111) crystal plane on the upper edges of a trench to increase the thickness of a gate oxide film to be formed on these regions while rounding the upper edges of a trench, resulting in a significant improvement in the characteristics of transistors, and a fabrication method thereof.

SUMMARY OF THE INVENTION

An object of the present invention is to provide a trench isolation structure which can improve the reliability of transistors and a gate dielectric film by increasing the thickness of a gate oxide film at the upper edges of a trench while simultaneously rounding the upper edges of a trench.

Another object of the present invention is to provide a semiconductor device having an improved isolation structure, so that a hump phenomenon and an inverse narrow width effect are prevented.

Still another object of the present invention is to provide a trench isolation method by which the upper edges of a trench are rounded, and thus the thickness of a gate oxide film at the upper edges of a trench is increased.

The first object is achieved by a trench isolation structure including: a trench formed in non-active regions of a semiconductor substrate, the top edges of the trench being rounded; an inner wall oxide film formed on the inner wall of the trench; a liner formed on the surface of the inner wall oxide film, the top of the liner being recessed from the surface of the semiconductor substrate; and a dielectric film for filling the trench in which the inner wall oxide film and the liner have been formed.

It is preferable that the inner wall oxide film has a thickness of 10 to 150 Å, and that the top ends of the liner are recessed by 0 to 500 Å from the surface of the semiconductor substrate, so that the upper edges of a trench are satisfactorily rounded.

The second object is achieved by a semiconductor device having a trench isolation structure, including: a trench formed in non-active regions of a semiconductor substrate, the top edges of the trench being rounded; an inner wall oxide film formed on the inner wall of the trench; a liner formed on the surface of the inner wall oxide film, the top of the liner being recessed from the surface of the semiconductor substrate; a dielectric film for filling the trench in which the inner wall oxide film and the liner have been formed; a gate dielectric film formed on active regions of the semiconductor substrate except for the trench, the edge portions of the gate dielectric film being thicker than the central portion; and a gate electrode formed on the gate dielectric film.

Preferably, the surface of the semiconductor substrate other than in the trench has a (100) plane, and the surface of a semiconductor substrate rounded at the top edges of the trench has a (111) plane.

The third object is achieved by a trench isolation method including: forming a trench in non-active regions of a semiconductor substrate; forming an inner wall oxide film on the inner wall of the trench; forming a silicon nitride liner on the surface of the inner wall oxide film; filling the trench with a dielectric film; and etching part of the silicon nitride liner so that the top ends of the silicon nitride liner are recessed from the surface of the semiconductor substrate.

The step of forming the trench includes: forming a pad oxide film on the semiconductor substrate; forming a pad nitride film on the pad oxide film; forming an etch mask pattern for defining regions on which the trenches are to be formed, using a photolithographic process; and forming the trenches by etching parts of the semiconductor substrate using the etch mask pattern. The step of filling the trench with a dielectric film includes: depositing a dielectric film on the resultant substrate on which the inner wall oxide film and the silicon nitride liner have been formed; and planarizing the surface of the dielectric film, Planarization of the dielectric film is achieved by chemical mechanical polishing (CMP) or etchback using the pad nitride film as an etch stop layer. The step of removing a pad nitride film which remains on the active regions of the semiconductor substrate is further included after the step of planarizing the surface of the dielectric film.

The step of removing the pad nitride film is followed by the step of etching part of the silicon nitride liner so that the top ends of the silicon nitride liner are recessed from the surface of the semiconductor substrate. The step of removing the pad nitride film is performed by wet etching.

After the step of etching the pad nitride film and part of the liner, the step of removing the pad oxide film is further included. The step of removing the pad oxide film can be followed by the step of oxidizing the surface of the semiconductor substrate.

According to the present invention, the amount of oxidation at the upper edges of a trench can be greatly increased in an oxidation process for forming a gate oxide film. This is accomplished by limiting the thickness of an inner wall oxide film formed on the inner wall of a trench to a certain level and forming a dent where the top portion of a liner is recessed from the surface of a semiconductor substrate. That is, the amount of oxidation at the upper edges of a trench in a semiconductor substrate is increased during subsequent oxidation for forming a gate oxide film, without rounding the upper edges of a trench on purpose, which results in rounding of the upper edges of a trench. The thickness of a gate oxide film at the upper edges of a trench is greater than at the center of an active region of a semiconductor substrate outside the trench. Thus, a hump phenomenon and an inverse narrow width effect occurring due to concentration of an electric field at the upper edges of a trench can be suppressed, and the reliability of a gate dielectric film can be improved.

BRIEF DESCRIPTION OF THE DRAWINGS

The above objects and advantages of the present invention, will become more apparent by describing in detail a preferred embodiment thereof with reference to the attached drawings in which.

DESCRIPTION OF THE PREFERRED EMBODIMENT

Figure 1:
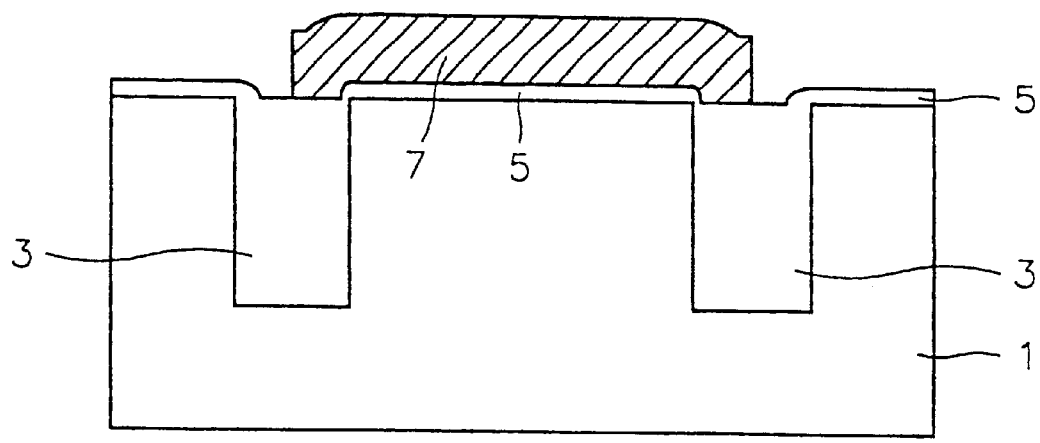
FIG. 1 is a cross-sectional view to explain a problem which has been encountered in a conventional shallow trench isolation (STI) method.
Figure 2:
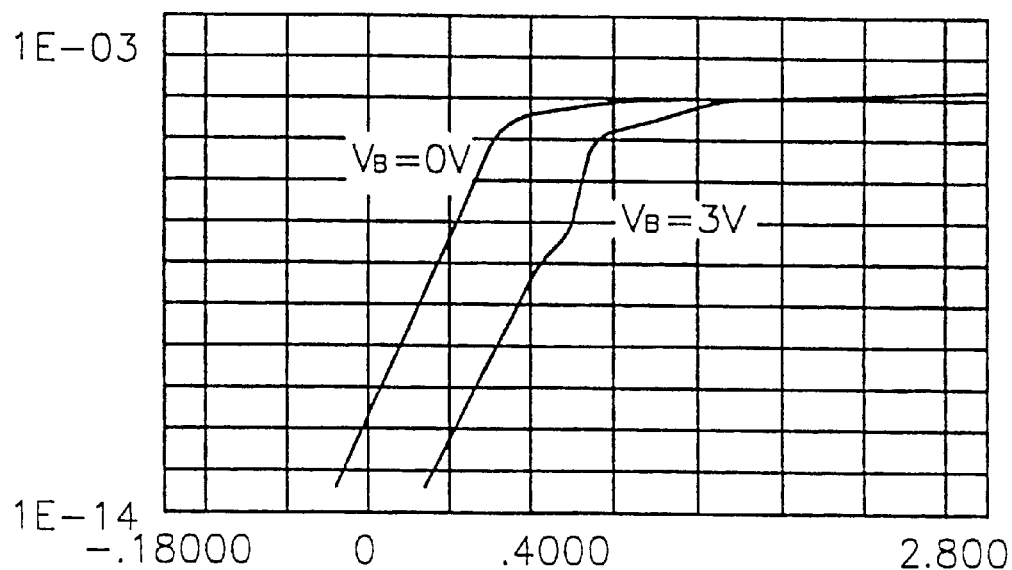
FIG. 2 is a graph showing a hump phenomenon occurring in a semiconductor device fabricated by a conventional STI method.
Figure 3:
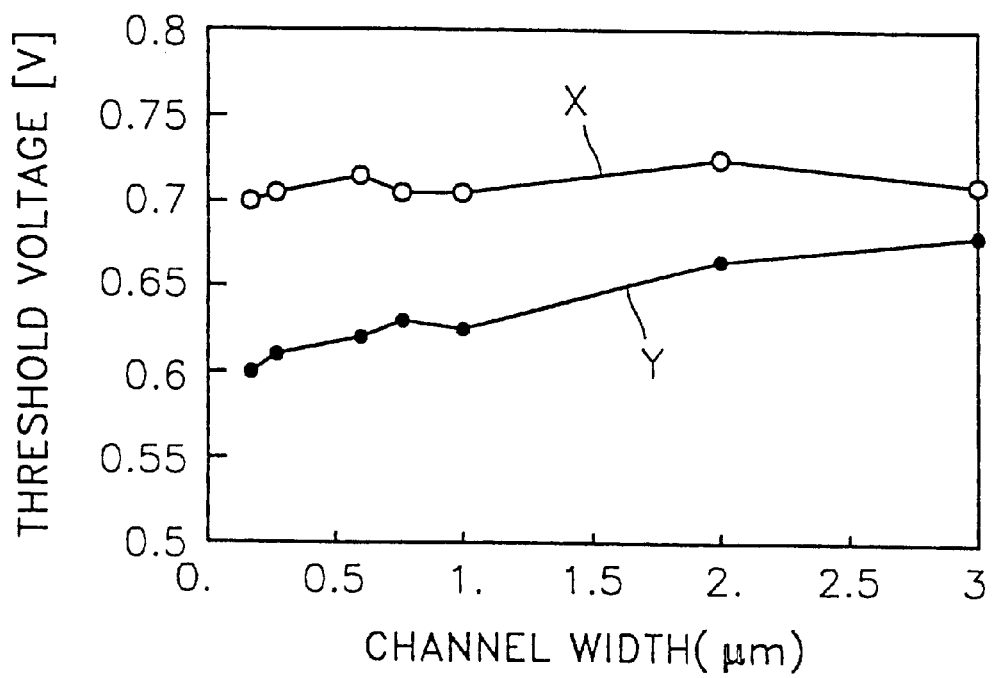
FIG. 3 is a graph showing an inverse narrow width effect occurring in an STI structure.

Hereinafter, an embodiment of the present invention will be described in detail with reference to the attached drawings. However, the embodiment of the present invention can be modified into various other forms, and the scope of the present invention must not be interpreted as being restricted to the embodiment. This embodiment is provided to more completely explain the present invention to those skilled in the art. In the drawings, the thicknesses of layers or regions are exaggerated for clarity. Like reference numerals in the drawings denote the same members. Also, when it is written that a layer is formed "on" another layer or a substrate, the layer can be formed directly on top of the other layer or the substrate, or other layers can intervene therebetween.

Figure 4:
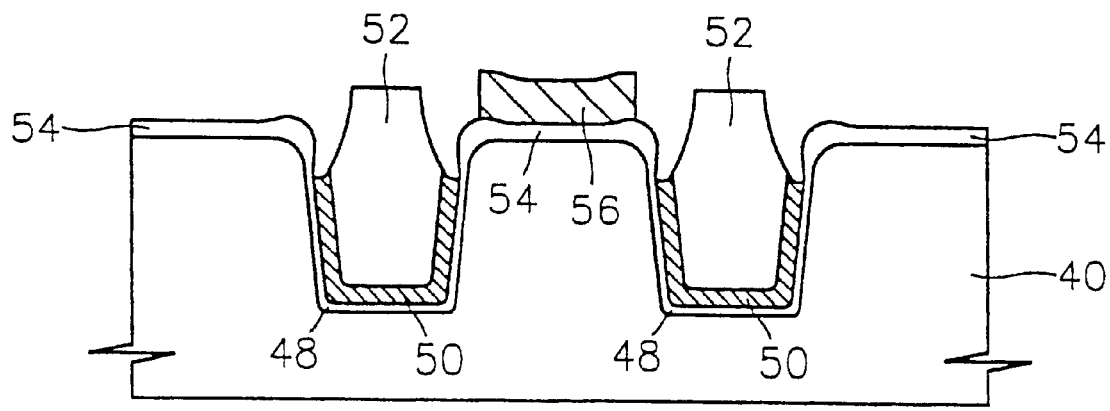
FIG. 4 is a cross-sectional view of a semiconductor device according to an embodiment of the present invention.

FIG. 4 shows a semiconductor device having an isolation device in which the upper edges of a trench are rounded, according to an embodiment of the present invention. Referring to FIG. 4, trenches, the upper edges of which are rounded toward an active region on which a semiconductor device is to be formed, are formed in non-active regions that are the isolation regions of a semiconductor substrate 40. An inner wall oxide film 48 and a liner 50 are sequentially formed along the inner wall of each of the trenches. The inner wall oxide film 48 is formed to a thickness of about 10 to 150 Å by wet or dry thermal oxidation. The liner 50 is formed of a nitride film, particularly, a silicon nitride film, by low pressure chemical vapor deposition (LPCVD) to a thickness of about 20 to 200 Å. In particular, the liner 50 is recessed from the surface of the semiconductor substrate 40 outside the trench, preferably recessed from the top of the trench, by a depth of about 0 to 500 Å.

The trench on which the inner wall oxide film and the liner have been formed is completely filled with a dielectric film 52 such as a CVD oxide film, and the dielectric film 52 has a planarized surface thereon.

A gate oxide film 54, which is a gate dielectric film, and a gate electrode 56 are formed on the active regions of the semiconductor substrate 40. In particular, the gate oxide film 54 is formed considerably thicker at the upper edges of a trench than on the surface of the semiconductor substrate 40.

According to a semiconductor device of the present invention having such a structure, the upper edges of a trench are rounded, and a gate oxide film is formed thicker at the upper edges of a trench than on the active regions of a semiconductor substrate. This leads to suppression of a hump phenomenon and an inverse narrow width effect caused by concentration of an electric field at the edges of a gate oxide film, and an improvement in the reliability of a gate dielectric film.

Figure 5A:
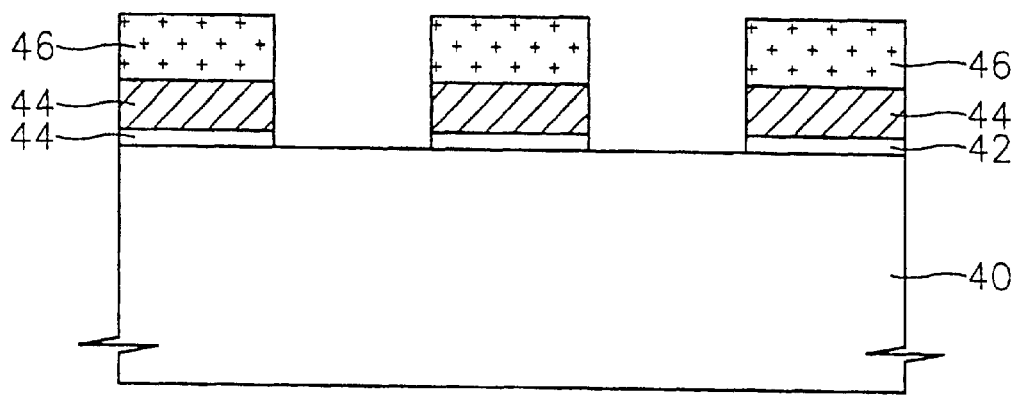
FIGS. 5A through 5F are cross-sectional views for illustrating a method of fabricating a semiconductor device having an isolation structure in which the upper edges of a trench are rounded, according to a preferred embodiment of the present invention.

FIGS. 5A through 5F are cross-sectional views for illustrating a method of fabricating a semiconductor device having an isolation structure in which the upper edges of a trench are rounded, according to a preferred embodiment of the present invention. Referring to FIG. 5A, a pad oxide film 42 for alleviating stress on a substrate and protecting the substrate is formed by growing a thermal oxide film of about 100 Å in thickness on a semiconductor substrate 40. A material having an excellent etch selectivity with respect to the semiconductor substrate 40, for example, a silicon nitride film, is deposited on the pad oxide film 42 to a thickness of about 1500 Å by low pressure chemical vapor deposition (LPCVD), thereby forming a pad nitride film 44. The pad nitride film 44 acts as an etch mask during substrate etching to form a subsequent trench or during planarization of a trench filler.

Next, a photoresist pattern 46, which is patterned so that non-active regions where trenches are to be formed can be exposed, is formed on the pad nitride film 44 by photolithography. The pad nitride film 44 and the pad oxide film 42 are anisotropically etched using the photoresist pattern 46 as an etch mask so that the non-active regions of the semiconductor substrate 40 are exposed. Alternatively, only the pad nitride film 44 can be anisotropically etched using the photoresist pattern 46 as an etch mask to form an etch mask pattern.

Figure 5B:
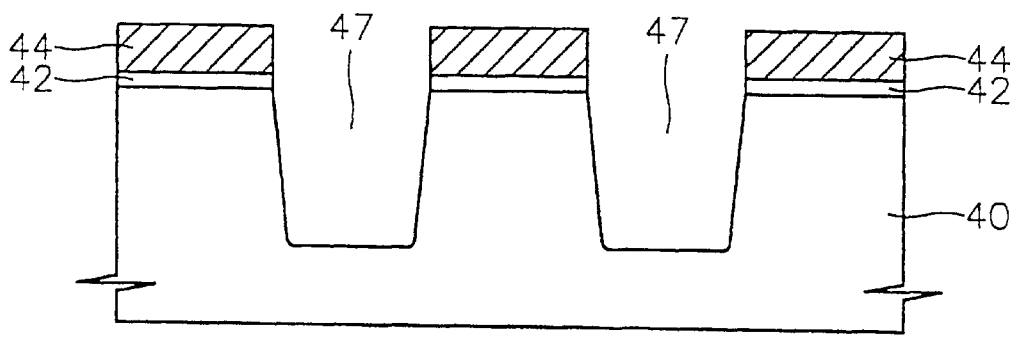

Referring to FIG. 5B, after the photoresist pattern 46 is removed, a trench 47 is formed by anisotropically etching exposed portions of the semiconductor substrate 40 by about 2000 to 10000 Å using the pad nitride film 44 and the pad oxide film 42 as etch mask patterns. Alternatively, the trench 47 can be formed using the photoresist pattern 46 as an etch mask pattern without removing the photoresist pattern 46. Meanwhile, since the upper edges of a trench are rounded in a subsequent process in the present invention, the trench 47 can be formed substantially perpendicular to the semiconductor substrate without a special process for rounding the upper edges.

Figure 5C:
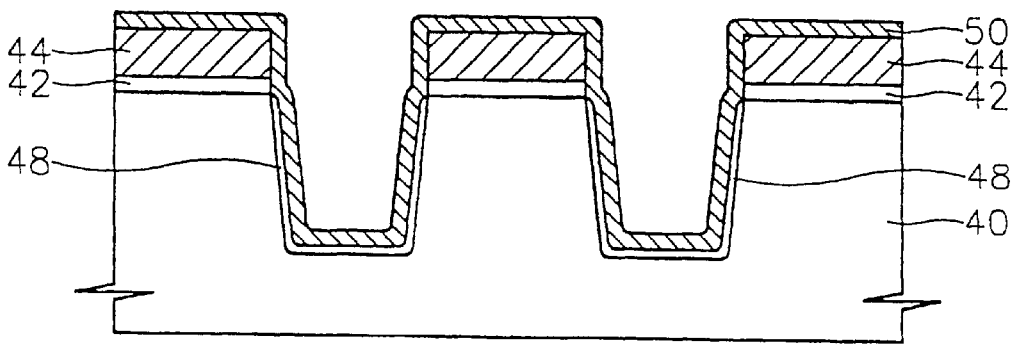

Referring to FIG. 5C, an inner wall oxide film 48 is formed along the inner wall of the trench 47 by a predetermined thermal oxidation on the semiconductor substrate 40 having the trenches 47. The inner wall oxide film 48 is formed to a thickness of about 10 to 150 Å, preferably, to about 10 to 50 Å. The reason why the inner wall oxide film is formed to be thin will be described later. Also, the inner wall oxide film 48 can be formed by wet oxidation or dry oxidation, preferably, by dry oxidation in which the thickness of an oxide film is easily controlled and its uniformity is high.

Thereafter, a liner 50 is formed by depositing a nitride film, for example, a silicon nitride film, on the entire surface of a resultant substrate on which the inner oxide film 48 is formed, by LPCVD. The liner 50 can be formed to a thickness of about 20 to 200 Å. A very thin liner is prone to break by a subsequent oxidation process. A very thick liner increases the aspect ratio of a trench, which may lead to difficulty in achieving perfect trench filling, such as, formation of voids when the trench is filled with a dielectric film.

Figure 5D:
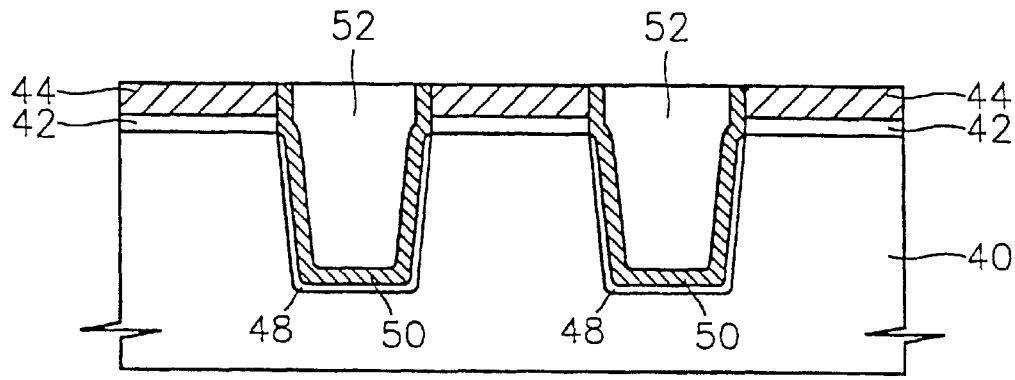

Referring to FIG. 5D, a dielectric material is deposited on the resultant structure on which the nitride film liner 50 has been formed, to a thickness that can sufficiently fill the trench, for example, equal to or less than 10000 Å, by CVD or other techniques, thereby forming an oxide film 52. After the trench is filled with the CVD oxide film 52, it is preferable that annealing is performed at a high temperature to densify the CVD oxide film.

The densification of the CVD oxide film 52 filling the trench is conducted to slow down the speed of chemical mechanical polishing (CMP) which is high during subsequent planarization of the CVD oxide film 52 because of the high etch rate of the CVD oxide film 52, and to prevent the CVD oxide film 52 from being easily consumed during wet etching of the pad oxide film 42 or during a cleaning process using an etchant. The densification of the CVD oxide film 52 is conducted at 1000° C. in a nitrogen gas ($N_2$) ambience, or achieved by wet oxidation. During this process, the semiconductor substrate 40 is not oxidized by the protection of the nitride liner 50.

Following this, the CVD oxide film 52 is planarized, for example, by etchback, CMP or combination of etchback and CMP. If CMP is performed, it is preferable that CMP is stopped when about half the thickness of the pad nitride film 44, which is used as an etch stop layer, is etched.

Figure 5E:
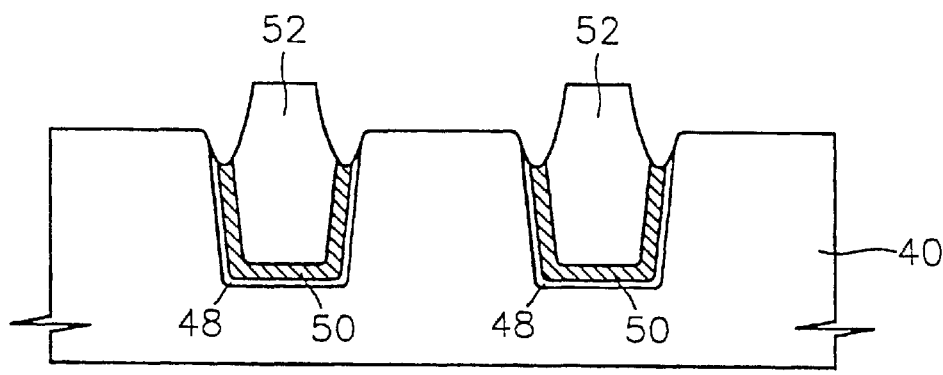
Figure 6:
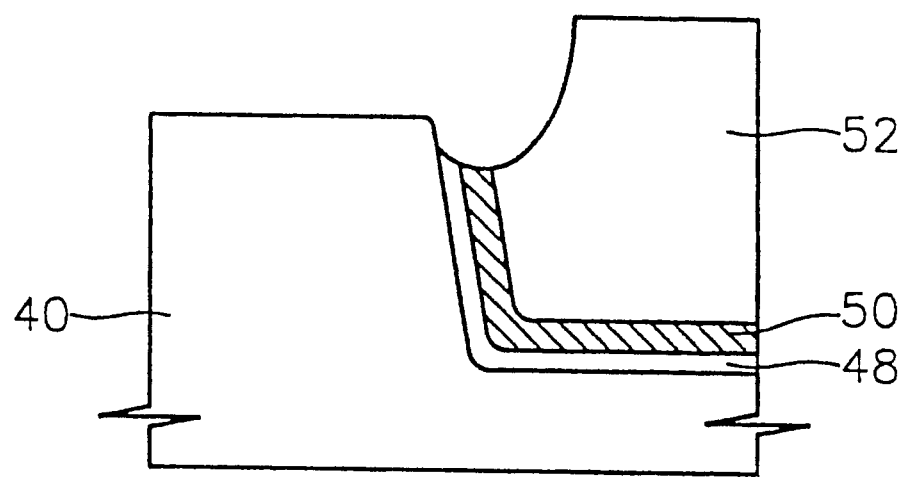
FIG. 6 is a partially magnified cross-sectional view showing a dent formed in a nitride liner on the top of a trench.

Referring to FIG. 5E, the pad nitride film remaining on the active regions is removed by a phophoric acid solution. At this time, over-etching is performed to also etch part of the nitride film liner 50, thereby forming a so-called "dent" where the top of the nitride liner 50 is recessed about 0 to 500 Å lower than the surface of the semiconductor substrate 40. A magnification of a semiconductor substrate having the dent is shown in FIG. 6. When a dent is formed on the top of the nitride liner 50, oxidation of the upper edges of a trench in a semiconductor substrate greatly increases. The reason for the increase of oxidation described above will be described later.

If a dent is formed very deeply, the top of the trench becomes open, so that the top edges of the trench are sharp-pointed during oxidation. When an MOS transistor is formed in a subsequent process, the top edges of a trench remain even after a conductive material for a gate is patterned, which may cause a bridge. Thus, in devices having a commonly-used gate oxide film of 100 Å or less in thickness, it is preferable that a dent recessed to 500 Å or less from the surface of the semiconductor substrate 40 is formed.

Thereafter, the pad oxide film 42 remaining in the active regions is removed using a diluted hydrofluoric acid (HF) solution.

Figure 5F:
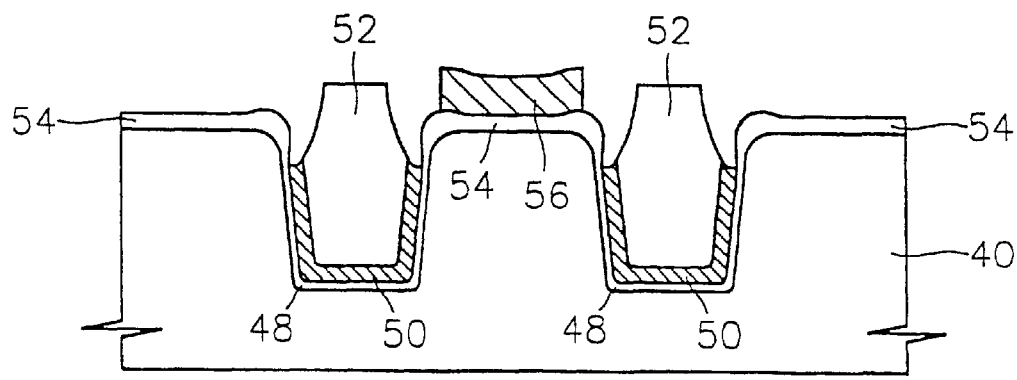

Referring to FIG. 5F, when a gate oxide film 54 is formed by thermal oxidation on the resultant structure of FIG. 5E, it is formed thicker at the top edges of a trench than the other portions, since oxidation at the top edges of a trench is increased as shown in this figure. Thus, the top edges of a trench become rounded. Then, a conductive material, for example, an impurity-doped polysilicon film or a stacked film of doped polysilicon and silicide, is formed on the gate oxide film 54, and then patterned by photolithography, thereby forming a gate electrode 56.

In this embodiment of the present invention described above, the thickness of the gate oxide film 54 at the top edges of a trench becomes greater than that of the gate oxide film 54 at the central portion of the active region of the semiconductor substrate 40 due to an increase in oxidation at the top edges of a trench. This can be considered to occur largely by the following three causes.

Figure 7:
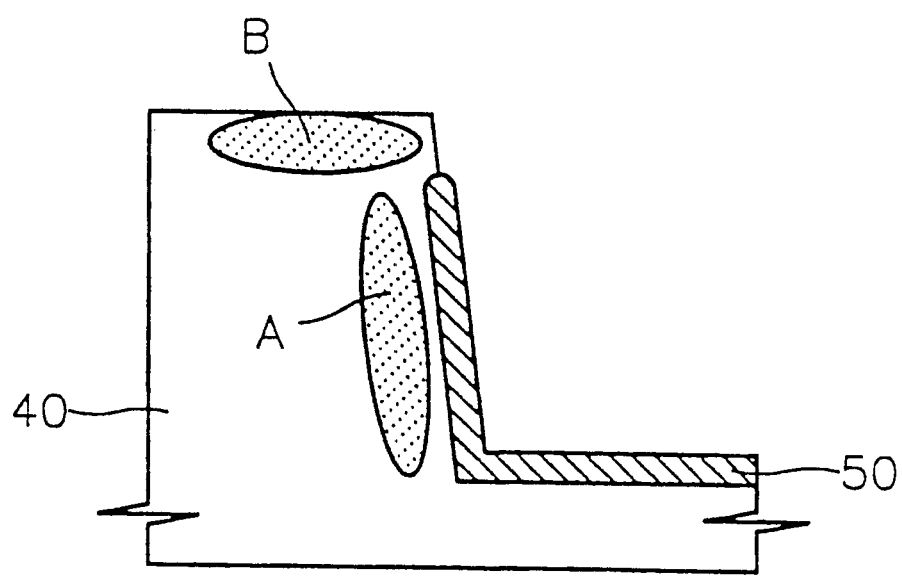
FIG. 7 is a partially magnified view for explaining an increase in the amount of oxidation on the top of a trench by tensile stress in a nitride liner on the inner wall of a trench.

The first cause can be tensile stress on the nitride liner 50 formed on the inner wall of a trench. This will be described with reference to FIG. 7, which is a partially magnified view of the sidewall of a trench. In FIG. 7, reference numeral 40 denotes a semiconductor substrate, and reference numeral 50 denotes a nitride liner. Here, the inner wall oxide film formed on the inner wall of the trench is ignored to simplify explanation.

The silicon nitride liner 50 deposited by LPCVD causes tensile stress on a portion B of the semiconductor substrate 40 which is near the surface of the active region. That is, since a silicon nitride film formed by LPCVD has a high thermal expansion coefficient compared to a silicon substrate, it expands more than the semiconductor substrate 40 formed of silicon single crystal during a high temperature process such as oxidation. Accordingly, the silicon nitride liner 50 is subject to tensile stress, while a portion A of the semiconductor substrate 40 on the sidewall of a trench in contact with the silicon nitride liner 50 is subject to compressive stress. Thus, the portion B of the semiconductor substrate 40 near the surface of the active region is subject to tensile stress, In this state where tensile stress has been applied, the length between the crystal lattices in the semiconductor substrate is long, so that oxidation occurs fast.

Thus, in order to round the top edges of a trench while maximizing the amount of oxidation of the upper edges of a trench by forming the silicon nitride liner 50, the thinner an inner wall oxide film between the silicon nitride liner 50 and the sidewall of a trench, the better. However, it is preferable that the thickness of the inner wall oxide film is kept within the range of about 10 to 150 Å.

The second cause can be formation of a dent in the silicon nitride liner 50. As shown in FIG. 6, a slanted surface is gradually formed while the semiconductor substrate 40 at the top edges of a trench exposed by a dent is being oxidized. This slanted surface has a (111) plane, and the surface of the active region of the semiconductor substrate 40 has a (100) plane. Since the interval between silicon crystal lattices is the greatest in the direction of the (111) plane, the bonding force between crystal lattices is weak. Accordingly, the bonding between silicon atoms located at each lattice point is easily cut during oxidation, so that oxidation occurs at the highest speed.

The third cause can be action of the silicon nitride liner 50 as an oxidation barrier. In a case where the liner 50 is not formed, oxygen atoms penetrate the CVD oxide film 48 filled in a trench and are diffused into the semiconductor substrate 40 below the sidewall of a trench, while the gate oxide film 54 of FIG. 5F is formed. Accordingly, oxidation also occurs on the sidewall of a trench. This leads to size expansion, and thus compressive stress is applied to the top edges of the semiconductor substrate 40, so that oxidation is suppressed. However, in the present invention, oxidation into the side of a trench on which the liner 50 is formed is prevented by the presence of the liner 50, while oxidation easily occurs at the top edges of a trench where the liner 50 is recessed, since the oxidation prevention factor, that is, the liner 50, is removed.

Figure 8:
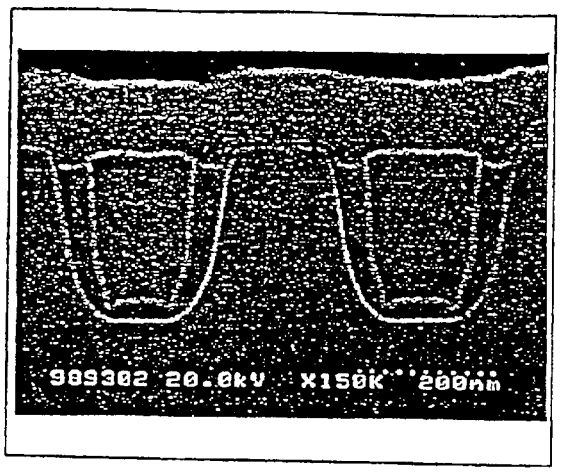
FIGS. 8 through 10 are scan electron microscope (SEM) pictures taken to ascertain the thickness of a gate oxide film at the upper edges of a trench and the degree of edge rounding, according to the thickness of an oxide layer formed on the inner wall of a trench.
Figure 9:
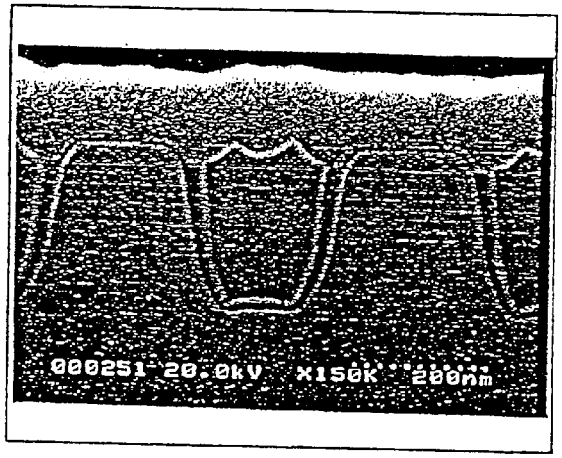
Figure 10:
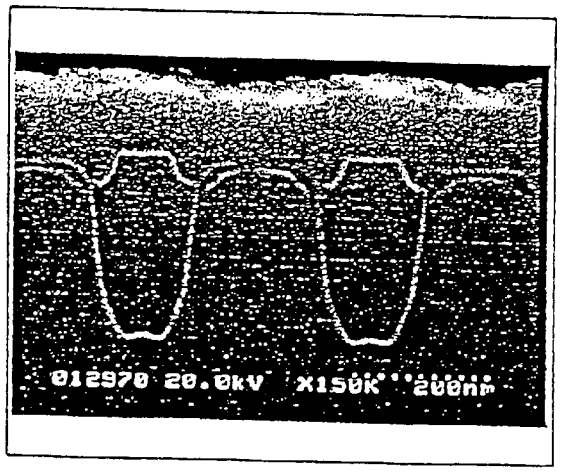

FIGS. 8 through 10 are scan electron microscope (SEM) pictures taken to ascertain the thickness of a gate oxide film at the upper edges of a trench and the degree of edge rounding, according to the thickness of an inner wall oxide film formed on the inner wall of a trench. In FIGS, 8 through 10, the inner wall oxide film is formed to thicknesses of 240 Å, 110 Å and 20 Å, respectively, a liner is formed to the same thickness, and the gate oxide film is grown to a thickness of 75 Å.

Referring to FIG. 8, it can be seen that the corners of a trench are not rounded and the thickness of a gate oxide film is not increased. The causes of these phenomena can be explained as follows. Firstly, since a liner subject to tensile stress is far from the sidewall of a trench subject to compressive stress by a thick inner wall oxide film, tensile stress has not been caused to the top of the semiconductor substrate. This is one reason why the corners of a trench are not rounded and the thickness of a gate oxide film is not increased. Secondly, since a liner has been formed on a thickly-grown inner wall oxide film, no downward recessed dents are formed on the top of a trench even when a pad nitride film is etched by a phosphoric acid solution. Thus, a slanted surface having a (111) plane is not formed at the top edges of a semiconductor substrate even when oxidation for forming a gate oxide film is performed. This is another reason why the corners of a trench are not rounded and the thickness of a gate oxide film is not increased. Thirdly, since the sidewall of a trench is much oxidized by many oxygen atoms diffused through the thick inner wall oxide film, compressive stress is exerted upon the top edges of a semiconductor substrate by the oxidation of the sidewall of a trench, so that the amount of oxidation is not increased. This is another reason why the corners of a trench are not rounded and the thickness of a gate oxide film is not increased.

FIG. 9 is an SEM picture of a case where an inner wall oxide film is formed to a thickness of 110 Å and a dent having a desirable depth is formed after a liner is formed. It can be seen from FIG. 9 that the top corners of a trench are rounded.

FIG. 10 is an SEM picture of a case where oxidation toward the side surface of a trench is extremely limited by the formation of an inner wall oxide film to a thickness of 20 Å within the trench, and the influence of tensile stress on a liner is maximized. It can be seen from FIG. 10 that the top edges of a trench are rounded and a gate oxide film at the top edges of a trench is about 170 Å thick that is significantly thicker than that on the surface of active regions.

The present invention has been described in detail by taking a particular embodiment as an example, but many modifications to the embodiment can be made within the scope of the present invention.

According to the present invention described above, when the thickness of an inner wall oxide film formed on the inner wall of a trench is restricted to a certain level, and a liner is formed, the amount of oxidation at the top edges of a trench in a subsequent process for forming a gate oxide film can be greatly increased. Therefore, a hump phenomenon and an inverse narrow width effect due to concentration of an electric field at the top edges of a trench can be suppressed, and the reliability of a gate dielectric film can be improved. Furthermore, a dent recessed from the surface of a semiconductor substrate is formed in a liner formed on the inner wall oxide film, so that the crystal state of a semiconductor substrate at the top edges of a trench becomes a (111) plane during formation of a gate oxide film. Thus, the amount of oxidation can be further increased.

What is claimed is:

1. A trench isolation structure, comprising:
   a trench formed in non-active regions of a semiconductor substrate, the trench having top edges that are rounded;
   an inner wall oxide film formed on an inner wall of the trench;
   a liner formed on a surface of the inner wall oxide film, a top of the liner being recessed from a surface of the semiconductor substrate;
   a dielectric film for filling the trench in which the inner wall oxide film and liner have been formed; and
   a thermal gate oxide film on the top edges of the trench and the surface of the semiconductor substrate, the thermal gate oxide film being thicker on the top edges of the trench than on the surface of the semiconductor substrate and spaced apart from the dielectric film.

2. The trench isolation structure of claim 1, wherein the inner wall oxide film has a thickness of 10 to 150 Å.

3. The trench isolation structure of claim 1, wherein the inner wall oxide film is a thermal oxide film formed by wet oxidation or dry oxidation.

4. The trench isolation structure of claim 1, wherein the top of the liner is recessed by 0 to 500 Å from the surface of the semiconductor substrate.

5. The trench isolation structure of claim 1, wherein the liner is formed of silicon nitride formed by low pressure chemical vapor deposition (LPCVD).

6. The trench isolation structure of claim 1, wherein the surface of the semiconductor substrate other than in the trench has a (100) plane, and the surface of the semiconductor substrate is rounded at the top edges of the trench and has a (111) plane.

7. A semiconductor device having a trench isolation structure, comprising:
   a trench formed in non-active regions of a semiconductor substrate, the trench having top edges that are rounded;
   an inner wall oxide film formed on an inner wall of the trench;
   a liner formed on a surface of the inner wall oxide film, a top of the liner being recessed from a surface of the semiconductor substrate;
   a dielectric film for filling the trench in which the inner wall oxide film and liner have been formed; and
   a thermal gate dielectric film formed on active regions of the semiconductor substrate except for the trench, the thermal gate dielectric film having edge portions that are thicker than a central portion and being spaced apart from the dielectric film.

8. The semiconductor device having the trench isolation structure of claim 7, wherein the inner wall oxide film has a thickness of 10 to 150Å.

9. The semiconductor device having the trench isolation structure of claim 7, wherein the top of the liner recessed by 0 to 500 Å from the surface of the semiconductor substrate.

10. The trench isolation structure of claim 1, wherein the surface of the semiconductor substrate other than in the trench has a (100) plane, and the surface of the semiconductor substrate is rounded at the top edges of the trench and has a (111) plane.

* * * * *